United States Patent
Lev et al.

(10) Patent No.: US 7,309,016 B2
(45) Date of Patent: Dec. 18, 2007

(54) SYSTEM AND METHOD OF A COMPUTER CARD SLOT AND BEZEL

(75) Inventors: Jeffrey A. Lev, Cypress, TX (US); Martin A. Mueller, The Woodlands, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 113 days.

(21) Appl. No.: 10/942,465

(22) Filed: Sep. 16, 2004

(65) Prior Publication Data

US 2006/0054698 A1 Mar. 16, 2006

(51) Int. Cl.
*G06K 7/10* (2006.01)
(52) U.S. Cl. .................. 235/472.01; 439/160; 235/441; 235/380
(58) Field of Classification Search ........... 235/472.01, 235/380, 441; 439/160, 638, 159
See application file for complete search history.

(56) References Cited

U.S. PATENT DOCUMENTS

| | | | |
|---|---|---|---|
| 5,470,241 A * | 11/1995 | Kaufman et al. ........... 439/159 |
| 5,473,505 A * | 12/1995 | Kessoku et al. ............ 361/684 |
| 5,625,534 A * | 4/1997 | Okaya et al. ............... 361/686 |
| 5,752,857 A | 5/1998 | Knights | |
| 6,015,092 A | 1/2000 | Postlewaite et al. | |
| 6,234,389 B1 | 5/2001 | Valliani et al. | |
| 6,343,945 B1 * | 2/2002 | Liikanen ..................... 439/160 |
| 6,371,376 B1 | 4/2002 | Dan | |
| 6,460,772 B1 * | 10/2002 | Stahl .......................... 235/486 |
| 6,641,034 B1 * | 11/2003 | Oki et al. ................... 235/380 |
| 2005/0020139 A1 * | 1/2005 | Hagiwara ................... 439/638 |

\* cited by examiner

*Primary Examiner*—Michael G. Lee
*Assistant Examiner*—Kristy A. Haupt

(57) ABSTRACT

A system and related method of a computer card slot and a bezel. Some of the exemplary embodiments may be a portable computer comprising a computer card slot accessible through an aperture in a housing of the portable computer, a card reader electrically coupled within the computer card slot, and a bezel mechanically abutting an outer end of the card reader (at least a portion of an outer face of the bezel substantially coplanar with the housing). The computer card slot comprises a computer card ejection actuation mechanism proximate to the aperture in the first side, and wherein the bezel at least partially covers the ejection actuation mechanism.

28 Claims, 2 Drawing Sheets

SYSTEM AND METHOD OF A COMPUTER CARD SLOT AND BEZEL

BACKGROUND

A smart card is a device similar in size and appearance to a credit card. Smart cards have embedded therein various electronic devices, such as a microcontroller and random access memory. Smart cards can perform a variety of tasks based to some extent on the identity of the user. For example, smart cards may be used to: control access to parking garages and/or buildings; make available and accessible user information such as biometric information and/or personal medical history; hold and provide personal encryption keys for secure communication; authenticate authorization for the holder to boot and/or use a computer system.

Some computer system purchasers, for example large corporations, demand portable computers, such as laptop or notebook computers, that authenticate the user's authorization prior to allowing the computer system to be used or to boot. Computer system manufacturers have thus implemented smart card reading electronics on the motherboards of portable computers. However, the number of purchasers desiring to use smart card technology in relation to the total number of computers sold is relatively small, and thus the addition of the dedicated smart card reading electronics to the motherboard adds an expense to the computer systems that is not justified in the minds of most consumers.

To address this problem, some computer system manufacturers may provide smart card reading devices in the form of Personal Computer Memory Card International Association (PCMCIA) standard compliant computer cards that may be plugged into PCMCIA slots on the computer system. However, this method of providing the smart card reading technology may be less desirable in the eyes of the consumer as it appears non-permanent. Moreover, PCMCIA slots may have a card ejection mechanism actuated by a button proximate to the aperture in the computer system housing, and therefore a computer system user may inadvertently remove and lose the smart card reading device, thus making it difficult for the user to utilize the computer system.

SUMMARY

The problems noted above are solved in large part by a system and related method of a computer card slot and a bezel. Some of the exemplary embodiments may be a portable computer comprising a computer card slot accessible through an aperture in a housing of the portable computer, a card reader electrically coupled within the computer card slot, and a bezel mechanically abutting an outer end of the card reader (at least a portion of an outer face of the bezel substantially coplanar with the housing). The computer card slot comprises a computer card ejection actuation mechanism proximate to the aperture in the housing, and wherein the bezel at least partially covers the ejection actuation mechanism.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure. In addition, one skilled in the art will understand that the following description has broad application, and the discussion of any embodiment is meant only to be exemplary of that embodiment, and not intended to intimate that the scope of the disclosure is limited to that embodiment.

Figure 1:
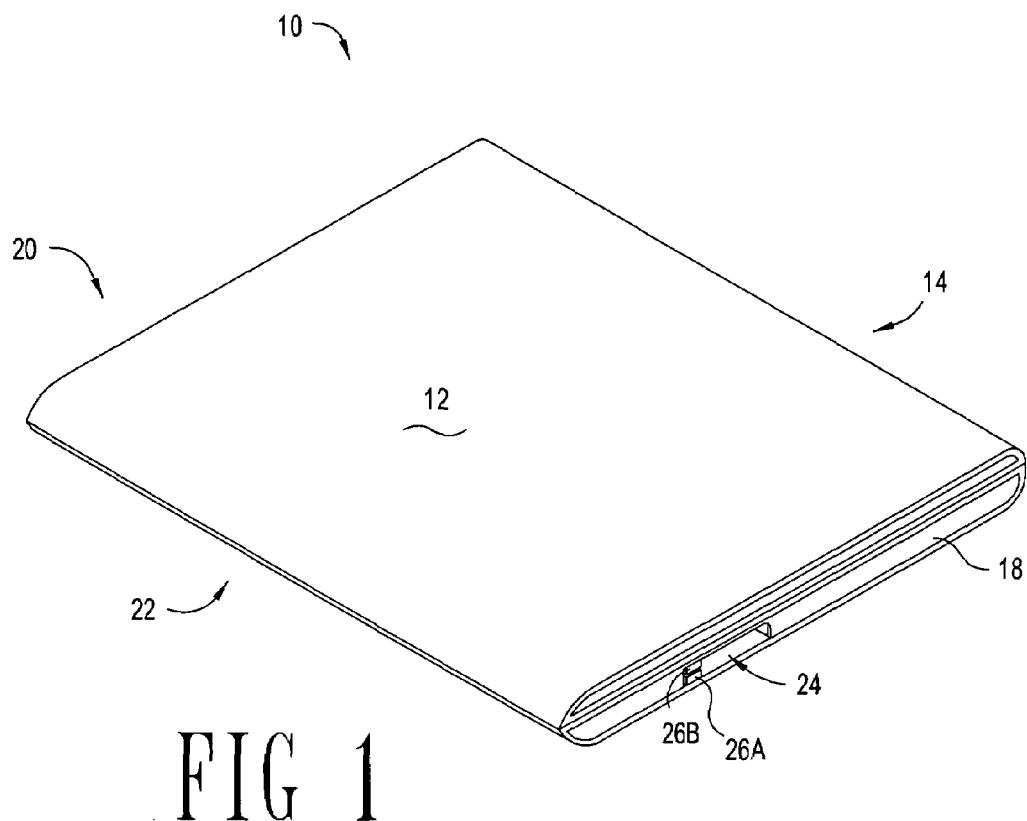
FIG. 1 shows a portable computer in accordance with embodiments of the invention.

FIG. 1 illustrates a portable computer 10, which may be, e.g., a notebook or laptop computer. The portable computer 10, shown in its closed position, comprises a top housing 12 hingedly coupled to a back 14. Though not specifically shown, the top housing 12 rotates about its hinge to reveal a video screen housed in the top housing 12. Portable computer 10 also comprises a first side 18 which is substantially parallel to a second side 20 (not visible in FIG. 1). Each of the sides 18 and 20 couple to a bottom housing 22, only a portion of which is visible in the illustration of FIG. 1.

A portable computer in accordance with embodiments of the invention may comprise externally accessible personal computer (PC) card slots 24. Any existing or after-developed size standards and/or communication protocols may be implemented by the card slots 24. At least some embodiments of the invention were developed in the context of Personal Computer Memory Card International Association (PCMCIA) slots, and thus the remaining disclosure discussion is based on card slots having this form factor and using any applicable communication protocol association with the PCMCIA standard. However, use of PCMCIA slots is merely exemplary, and should not be construed as a required element of any of the embodiments of the invention. Particularly, FIG. 1 illustrates two exemplary PCMCIA slots 24, each capable of accepting one PCMCIA standard compliant PC card (cards not specifically shown in FIG. 1).

PCMCIA slots in accordance with embodiments of the invention may utilize a mechanically operated ejection mechanism (not specifically shown in FIG. 1) that is actuated by one or more ejection actuation mechanisms 26A and 26B. Some PCMCIA cards that mechanically and electrically couple within one of the PCMCIA slots 24 may leave no, or at least an insignificant, portion of the card extending beyond the plane defined by the side 18. Thus, it may be necessary for an operator to push the ejection actuation mechanism 26A/B to at least partially eject the PCMCIA card from the portable computer 10 for removal.

Figure 2:
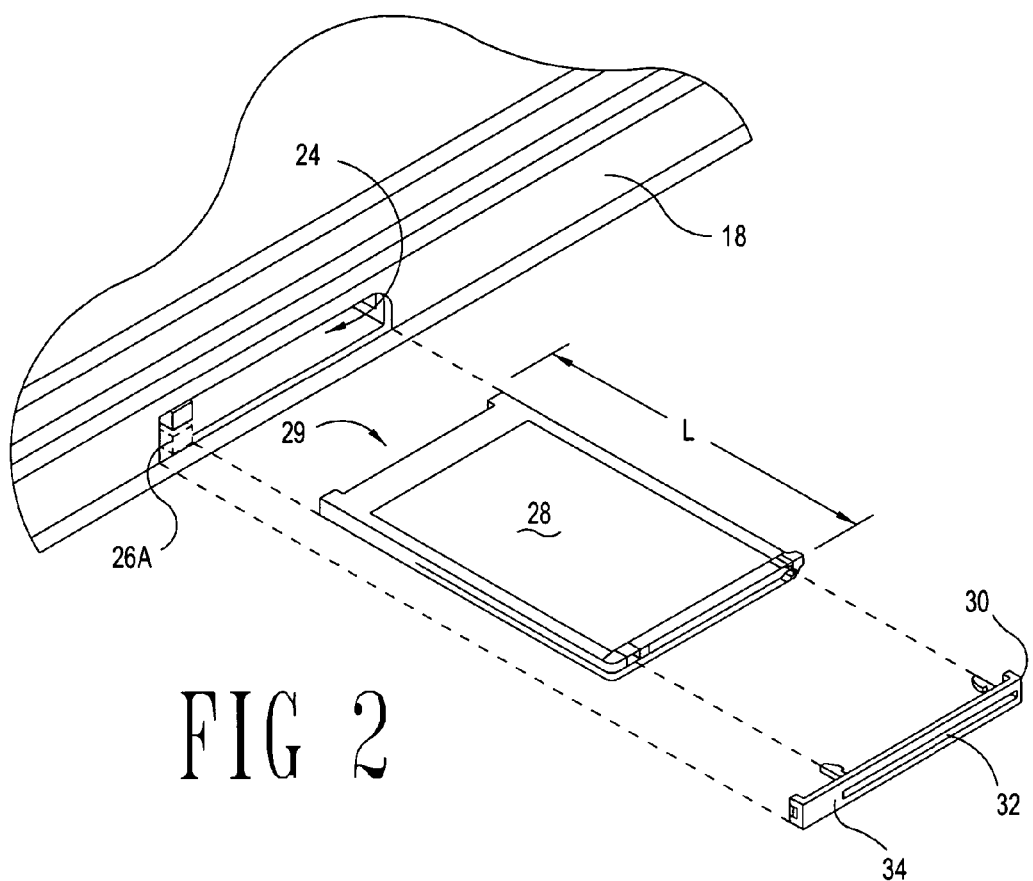
FIG. 2 shows a portable computer, computer card and bezel in accordance with embodiments of the invention.

Some portable computer purchasers may require smart card reading technology to perform tasks such as user authentication prior to booting of the portable computer, e.g., by having the smart card reader verify the user's identity by reading information from a user held smart card. In order to provide the smart card functionality without the necessity of implementing the smart card electronics on the computer system motherboard, some embodiments of the invention may utilize a PCMCIA-based smart card reader in combination with the computer system 10. The PCMCIA-based smart card reader may electrically and mechanically couple into one of the PCMCIA slots 24. However, it may be desirable to give the appearance to the end user that the smart card reader is a permanent fixture of the portable computer 10, and further it may be desirable to make it difficult for the computer system user to inadvertently remove the PCMCIA-based smart card reader from the portable computer 10. FIG. 2 illustrates various embodiments of the invention which at least partially address these goals.

In particular, FIG. 2 illustrates in exploded view the PCMCIA slots 24, an exemplary PCMCIA card 28 to be plugged into one of PCMCIA slots 24, and a bezel 30, in accordance with at least some embodiments of the invention. The PCMCIA card 28, which in some embodiments may be a PCMCIA-based smart card reader, can be inserted into the one of the PCMCIA slots 24. The card reader 28 has electrical connectors 29 on a first end that electrically couple electronic devices within the card body to electronic devices of the portable computer 10. Either prior to or after insertion of the card reader 28, a bezel 30 is mechanically coupled to at least the card reader 28 at an end opposite the electrical connectors 29. An aperture 32 enables the insertion of a smart card through the bezel 30 and into the card reader 28 to electrically couple to the smart card reading mechanism.

The bezel 30 in accordance with embodiments of the invention may also comprise an extension portion 34. As illustrated in FIG. 2, the extension portion 34 at least partially covers the ejection actuation mechanism 26A. Thus, once the card reader 28 and bezel 30 are in place, it is more difficult for a computer system user to remove the card reader 28, as the removal procedure of pushing the ejection actuation mechanism may not be possible, or is at least less readily apparent.

In at least some embodiments of the invention, ejection actuation mechanisms 26 may comprise a plastic button portion that mechanically couples to other mechanical components that provide the ejection functionality. Because the bezel 30, when installed, may be substantially coplanar with the side 18, the plastic button may need to be removed prior to installation of the bezel. To this same end, the card reader 28 may have a slightly shorter length L than a standard PCMCIA-based card. In particular, the PCMCIA standard length for a card is 85.6 mm. In accordance with embodiments of the invention, a card reader 28 may be slightly shorter, for example on the order of 80 mm, such that with the addition of the bezel 30 at least a portion of the front face of the bezel and the side 18 are substantially coplanar.

Figure 3:
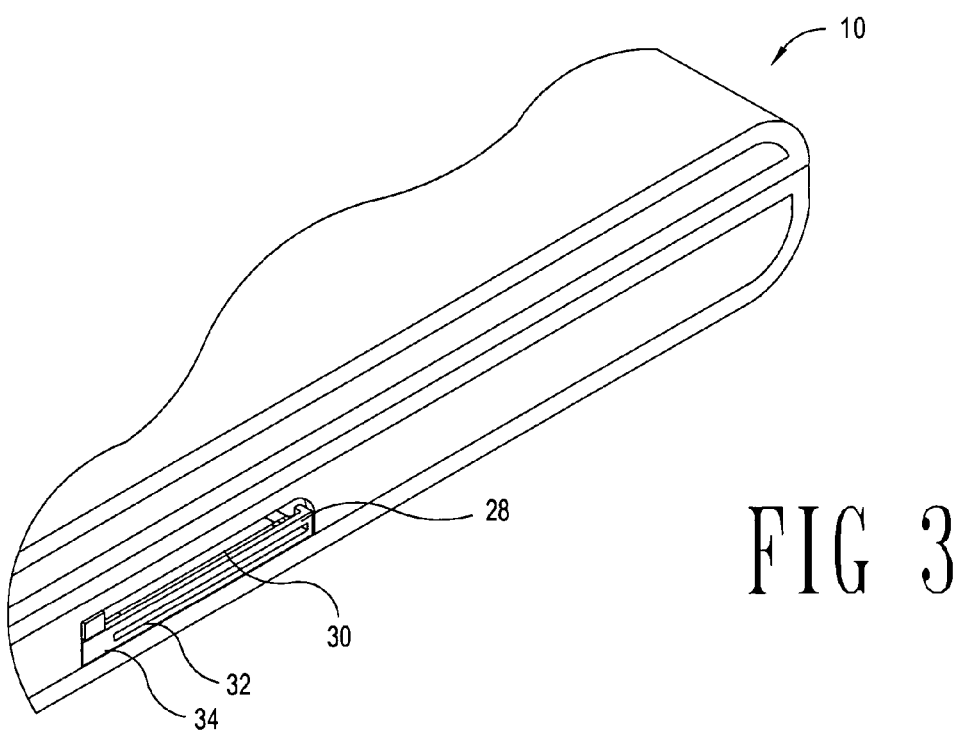
FIG. 3 shows a computer card and bezel in their installed configuration in accordance with embodiments of the invention.

FIG. 3 illustrates the portable computer 10 after insertion of the card reader 28 and coupling of the bezel 30 to the card reader 28 and/or the portable computer 10. As can be seen, only one card reader and respective bezel are in place within one of the two illustrated PCMCIA slots 24. After insertion, a card reader 28 and its corresponding bezel 30 occupies one of the slots, and the extension portion 34 of the bezel 30 hides or makes inaccessible the respective ejection actuation mechanism. Thus, once installed the card reader 28 and bezel 30 become a semi-permanent fixture of the portable 10, appearing permanent to the average computer system user. If the exemplary card reader 28 is a smart card reader used as a boot verification device, a user may insert his or her smart card through the aperture 32 just prior to or during the boot process, thus enabling the reader to communicate with the smart card and verify authorization. Using a smart card reader as a boot authorization is merely exemplary. The smart card reader may be used for any currently existing or after-developed purpose, such as online transactions using the smart card for payment, securely providing personal information, and providing public and/or private keys for encrypted communications.

Figure 4:
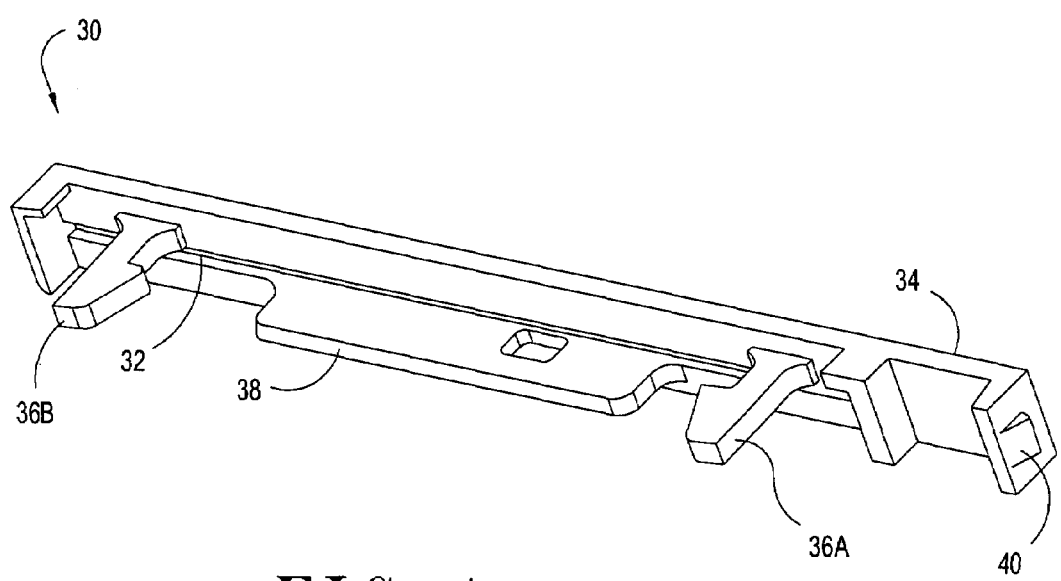
FIG. 4 shows a bezel in accordance with at least some embodiments of the invention.

FIG. 4 shows the bezel 30 in greater detail. The bezel 30 may couple to the portable computer 10 in one or more ways. In some embodiments, the bezel 30 may couple to the portable computer by coupling to the card 28. In exemplary embodiments the bezel 30 may couple by way of engaging tabs 36 and tongue 38. In particular, in order to accept a smart card, a smart card reader may have an upper portion and a lower portion with a gap therebetween for insertion of the smart card. The engaging tabs 36 would thus couple to an upper portion of the card 28, while the tongue 38 would couple to the lower portion (the tabs and tongue coupling location may be reversed without departing from the scope and spirit of the invention). In addition to, or in place of, coupling directly to the card 28, the bezel 30 may couple to the side 18 (FIG. 2). In particular, bezel 30 may comprise a protrusion 40 on each end of the bezel (only one protrusion visible in FIG. 3). The protrusion 40 may form a friction fit with the inside diameter of the PCMCIA slot 24. Alternatively, the inside diameter of the PCMCIA slot may have a mating indention for protrusion 40.

The various embodiments described to this point are based on a PCMCIA-based smart card reader. However, in alterative embodiments of the invention any electronic media reader may be used, including other form factors and/or standards of PC cards. For example, the card reader 28 may be a storage media reader capable of accepting and electrically coupling to media devices such as memory sticks. In these embodiments, the bezel 30, and in particular the aperture 32, may be of different sizes to accommodate insertion of these various storage media. Moreover, the storage media reader may also be a PCMCIA-based reader, with the bezel 30 covering the ejection actuation mechanism.

What is claimed is:

1. A portable computer comprising:
   a computer card slot accessible through an aperture in a housing of the portable computer;
   a card reader electrically coupled within the computer card slot; and
   a bezel mechanically abutting an outer end of the card reader, at least a portion of an outer face of the bezel substantially coplanar with the housing;
   wherein the computer card slot comprises a computer card ejection actuation mechanism proximate to the aperture in the housing, and wherein the bezel at least partially covers the ejection actuation mechanism.

2. The portable computer as defined in claim 1 wherein the bezel fully covers the ejection actuation mechanism.

3. The portable computer as defined in claim 1 wherein the card reader further comprises a smart card reader, and wherein the bezel further comprises an aperture enabling insertion of a smart card through the bezel to electrically couple to the smart card reader.

4. The portable computer as defined in claim 1 wherein the card reader further comprises a storage media reader, and wherein the bezel further comprises an aperture enabling insertion of a storage media through the bezel to electrically couple to the media reader.

5. The portable computer as defined in claim 1 further comprising a second computer card slot accessible through the aperture in the housing, and wherein second computer card slot is accessible when the card reader is electrically coupled within its computer card slot.

6. The portable computer as defined in claim 1 wherein the computer card slot is a Personal Computer Memory Card International Association (PCMCIA) compliant card slot, and wherein the computer card is PCMCIA compliant.

7. A card reader comprising:
   electrical connectors on a first end of a card body, the electrical connectors electrically couple electronic devices at least partially within the card body to electronic devices of a computer system; and
   a bezel on a second end of the card body opposite the first end, a plane defined by a front face of the bezel substantially perpendicular to a plane defined by a length and width of the card body;
   wherein the bezel comprises an extension portion at least partially within the plane defined by the front face, wherein when the card reader is installed in a computer system the extension portion at least partially hides a card ejection actuation mechanism.

8. The card reader as defined in claim 7 wherein the bezel further comprises an aperture that enables insertion of devices at least partially within the card body.

9. The card reader as defined in claim 7 wherein the card reader is a Personal Computer Memory Card International Association (PCMCIA) standard compliant computer card.

10. The card reader as defined in claim 7 wherein the card reader is smart card reader.

11. The card reader as defined in claim 7 wherein the card reader is a storage media reader.

12. A method comprising:
    inserting a card reader into an externally accessible computer card slot of a portable computer;
    coupling a bezel to an outer end of the card reader; and
    covering, with the bezel, a card ejection actuation mechanism of the computer card slot.

13. The method as defined in claim 12 further comprising inserting a Personal Computer Memory Card International Association (PCMCIA) standard compliant card reader into the computer card slot.

14. The method as defined in claim 12 further comprising inserting a smart card reader into the computer card slot.

15. The method as defined in claim 14 further comprising inserting a Personal Computer Memory Card International Association (PCMCIA) standard compliant smart card reader into the computer card slot.

16. The method as defined in claim 12 further comprising inserting an electronic media reader into the computer card slot.

17. The method as defined in claim 12 wherein covering further comprises preventing actuation of the card ejection actuation mechanism by the bezel.

18. A portable computer comprising:
    a means for encasing electronics of a portable computer;
    a means for accepting externally inserted computer cards accessible through an aperture in the means for encasing, the means for accepting comprising a card ejection actuation mechanism; and
    a means for covering the aperture and the card ejection actuation mechanism, the means for covering adapted to mechanically abut an outer end of a computer card couplable within the means for accepting.

19. The portable computer as defined in claim 18 further comprising a computer card electrically coupled within the means for accepting.

20. The portable computer as defined in claim 19 wherein the computer card further comprises a smart card reader.

21. The portable computer as defined in claim 19 wherein the computer card further comprises a storage media reader.

22. The portable computer as defined in claim 19 wherein the computer card is a Personal Computer Memory Card International Association (PCMCIA) standard compliant card.

23. A portable computer comprising:
    a computer card slot accessible through an aperture in a housing of the portable computer, the computer card slot comprises an ejection actuation mechanism proximate to the aperture;
    a bezel mechanically covering at least a portion of the computer card slot, an outer face of the bezel substantially coplanar with the housing, and wherein the bezel at least partially covers the ejection actuation mechanism.

24. The portable computer as defined in claim 23 wherein the bezel further comprises an aperture enabling insertion of a smart card into a smart card reader couplable within the computer card slot.

25. The portable computer as defined in claim 24 wherein an inner face of the bezel abuts the smart card reader.

26. The portable computer as defined in claim 24 wherein an inner face of the bezel couples to the smart card reader.

27. The portable computer as defined in claim 23 wherein the bezel further comprises an aperture enabling insertion of an electronic media into an electronic media reader couplable within the computer card slot.

28. The portable computer as defined in claim 23 further comprising:
    a second computer card slot accessible through the aperture in the housing, the second computer card slot comprises an ejection actuation mechanism proximate to the aperture;
    a second bezel mechanically covering at least a portion of the computer card slot, an outer face of the bezel substantially coplanar with the housing, and wherein the bezel at least partially covers the respective ejection actuation mechanism.

* * * * *